(12) United States Patent
Orris et al.

(10) Patent No.: US 11,349,238 B2
(45) Date of Patent: May 31, 2022

(54) POWER CONNECTOR ASSEMBLY FOR A MEZZANINE CONNECTOR SYSTEM

(71) Applicant: TE Connectivity Services GmbH, Schaffhausen (CH)

(72) Inventors: David Patrick Orris, Middletown, PA (US); Howard Wallace Andrews, Jr., Hummelstown, PA (US)

(73) Assignee: TE CONNECTIVITY SERVICES GMBH, Schaffhausen (CH)

( * ) Notice: Subject to any disclaimer, the term of this patent is extended or adjusted under 35 U.S.C. 154(b) by 170 days.

(21) Appl. No.: 16/879,321

(22) Filed: May 20, 2020

(65) Prior Publication Data
US 2021/0367365 A1    Nov. 25, 2021

(51) Int. Cl.
| | |
|---|---|
| H01R 12/73 | (2011.01) |
| H01R 12/70 | (2011.01) |
| H01Q 21/20 | (2006.01) |
| H01R 12/72 | (2011.01) |
| H01Q 1/38 | (2006.01) |
| H01R 12/71 | (2011.01) |

(52) U.S. Cl.
CPC ............. H01R 12/737 (2013.01); H01Q 1/38 (2013.01); H01Q 21/20 (2013.01); H01R 12/7088 (2013.01); H01R 12/712 (2013.01); H01R 12/721 (2013.01)

(58) Field of Classification Search
CPC ............. H01R 12/737; H01R 12/7088; H01R 12/712; H01Q 1/38; H01Q 21/20

USPC .......................................................... 439/62
See application file for complete search history.

(56) References Cited

U.S. PATENT DOCUMENTS

| | | | |
|---|---|---|---|
| 8,257,102 B2 | 9/2012 | Delgado et al. | |
| 8,632,365 B2* | 1/2014 | Ngo | H01R 12/721 439/636 |
| 8,690,589 B2* | 4/2014 | Ngo | H01R 12/7052 439/79 |
| 8,840,415 B2 | 9/2014 | Orris et al. | |
| 2009/0298303 A1* | 12/2009 | Vrenna | H01R 12/716 439/55 |
| 2011/0300759 A1* | 12/2011 | Ngo | H01R 31/005 439/630 |
| 2012/0099269 A1* | 4/2012 | Tan | G06F 1/20 361/679.32 |
| 2012/0307447 A1* | 12/2012 | Wu | G06F 1/20 361/679.48 |
| 2015/0011127 A1* | 1/2015 | Ngo | H01R 4/48 439/626 |

* cited by examiner

*Primary Examiner* — Peter G Leigh

(57) ABSTRACT

A power connector assembly includes a power card edge connector and a bladed power connector. The power card edge connector includes a housing mounted to a first circuit board and having a card slot with power contacts surface mounted to the first circuit board. The bladed power connector includes a dielectric frame extending between a first end configured to face a second circuit board and a second end received in the card slot. The bladed power connector includes a first blade at a first side of the dielectric frame and a second blade at a second side of the dielectric frame. The blades include mating edges and a terminating ends opposite the mating edges. The terminating ends includes press-fit pins configured to be press-fit into the second circuit board.

20 Claims, 3 Drawing Sheets

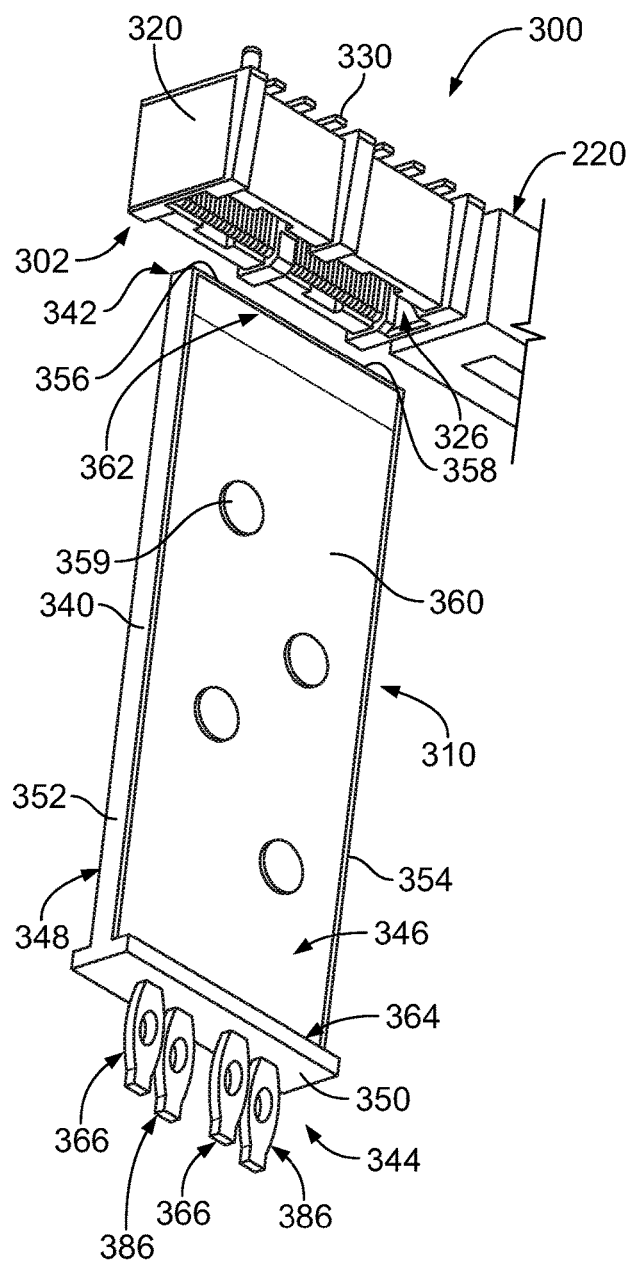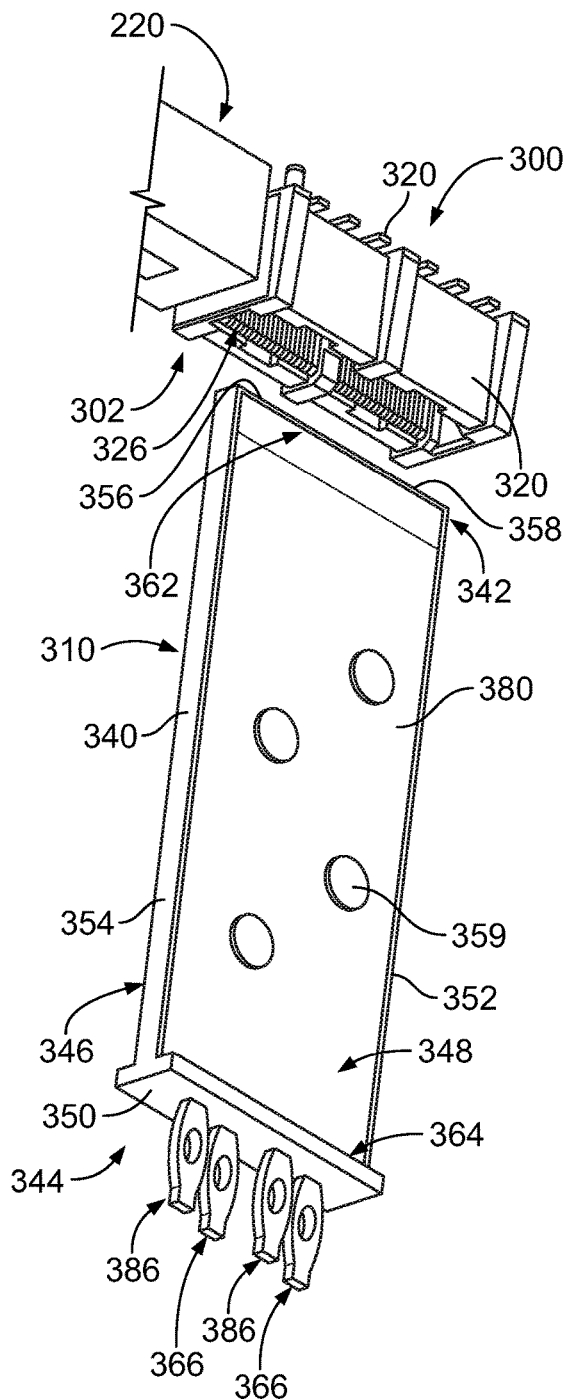
FIG. 3
FIG. 4

POWER CONNECTOR ASSEMBLY FOR A MEZZANINE CONNECTOR SYSTEM

BACKGROUND OF THE INVENTION

The subject matter herein relates generally to mezzanine connectors.

Mezzanine connectors are used to electrically connect a first circuit board and a second circuit board. Mezzanine connectors typically use card edge connectors and circuit cards to electrically connect the circuit boards. Known mezzanine connectors are not without disadvantages. For instance, some systems have need for transmitting power between the first and second circuit boards. Circuit cards are limited in the amount of power that can be transmitted. For instance, the circuits of the circuit boards have limits on current carrying capacity.

A need remains for a cost effective and reliable mezzanine connector for transferring power between circuit boards.

BRIEF DESCRIPTION OF THE INVENTION

In one embodiment, a power connector assembly is provided including a power card edge connector and a bladed power connector coupled to the power card edge connector. The power card edge connector includes a housing extending between a first end configured to be mounted to a first circuit board and a second end having a card slot. The power card edge connector includes power contacts held by the housing including first contact ends configured to be surface mounted, press-fit or soldered to the first circuit board and second contact ends extending into the card slot. The bladed power connector includes a dielectric frame extending between a first end configured to face a second circuit board and a second end received in the card slot. The dielectric frame has a first side and a second side opposite the first side. The bladed power connector includes a first blade at the first side of the dielectric frame and a second blade at the second side of the dielectric frame. The first blade includes a first mating edge and a first terminating end opposite the first mating edge. The first terminating end includes first press-fit pins configured to be press-fit into the second circuit board. The second blade includes a second mating edge and a second terminating end opposite the second mating edge. The second terminating end includes second press-fit pins configured to be press-fit into the second circuit board.

In another embodiment, a mezzanine connector system is provided including a data connector assembly and a power connector assembly separate and discrete from the data connector assembly. The data connector assembly includes a data card edge connector and a circuit card coupled to the data card edge connector. The data card edge connector includes a connector housing configured to be mounted to a first circuit board. The connector housing has a card slot receiving the circuit card. The data card edge connector includes signal contacts and ground contacts held by the connector housing for mating with the circuit card. The signal contacts and the ground contacts are configured to be surface mounted to the first circuit board. The power connector assembly includes a power card edge connector and a bladed power connector coupled to the power card edge connector. The power card edge connector includes a housing extending between a first end configured to be mounted to the first circuit board and a second end including a card slot. The power card edge connector includes power contacts held by the housing including first contact ends configured to be surface mounted to the first circuit board and second contact ends extending into the card slot. The bladed power connector includes a dielectric frame holding a first blade at a first side of the dielectric frame and a second blade at a second side of the dielectric frame. The first blade includes a first mating edge being received in the card slot and a first terminating end opposite the first mating edge. The first terminating end includes first press-fit pins or solder pins configured to be press-fit into a second circuit board. The second blade includes a second mating edge received in the card slot and a second terminating end opposite the second mating edge. The second terminating end includes second press-fit pins configured to be press-fit into the second circuit board.

In another embodiment, an antenna assembly (or mezzanine Card of undetermined process) is provided including a first circuit board having a first board surface and a second circuit board spaced apart from and parallel to the first circuit board and having a second board surface facing the first board surface. The antenna assembly includes a data connector assembly and a power connector assembly separate and discrete from the data connector assembly. The data connector assembly includes a data card edge connector and a circuit card coupled to the data card edge connector. The data card edge connector includes a connector housing configured to be mounted to a first circuit board. The connector housing has a card slot receiving the circuit card. The data card edge connector includes signal contacts and ground contacts held by the connector housing for mating with the circuit card. The signal contacts and the ground contacts are configured to be surface mounted to the first circuit board. The power connector assembly includes a power card edge connector and a bladed power connector coupled to the power card edge connector. The power card edge connector includes a housing extending between a first end configured to be mounted to the first circuit board and a second end including a card slot. The power card edge connector includes power contacts held by the housing including first contact ends configured to be surface mounted to the first circuit board and second contact ends extending into the card slot. The bladed power connector includes a dielectric frame holding a first blade at a first side of the dielectric frame and a second blade at a second side of the dielectric frame. The first blade includes a first mating edge being received in the card slot and a first terminating end opposite the first mating edge. The first terminating end includes first press-fit pins configured to be press-fit into a second circuit board. The second blade includes a second mating edge received in the card slot and a second terminating end opposite the second mating edge. The second terminating end includes second press-fit pins configured to be press-fit into the second circuit board.

BRIEF DESCRIPTION OF THE DRAWINGS

FIG. 3 is a front perspective view of the power connector assembly in accordance with an exemplary embodiment.

FIG. 4 is a rear perspective view of the power connector assembly in accordance with an exemplary embodiment.

DETAILED DESCRIPTION OF THE INVENTION

Figure 1:
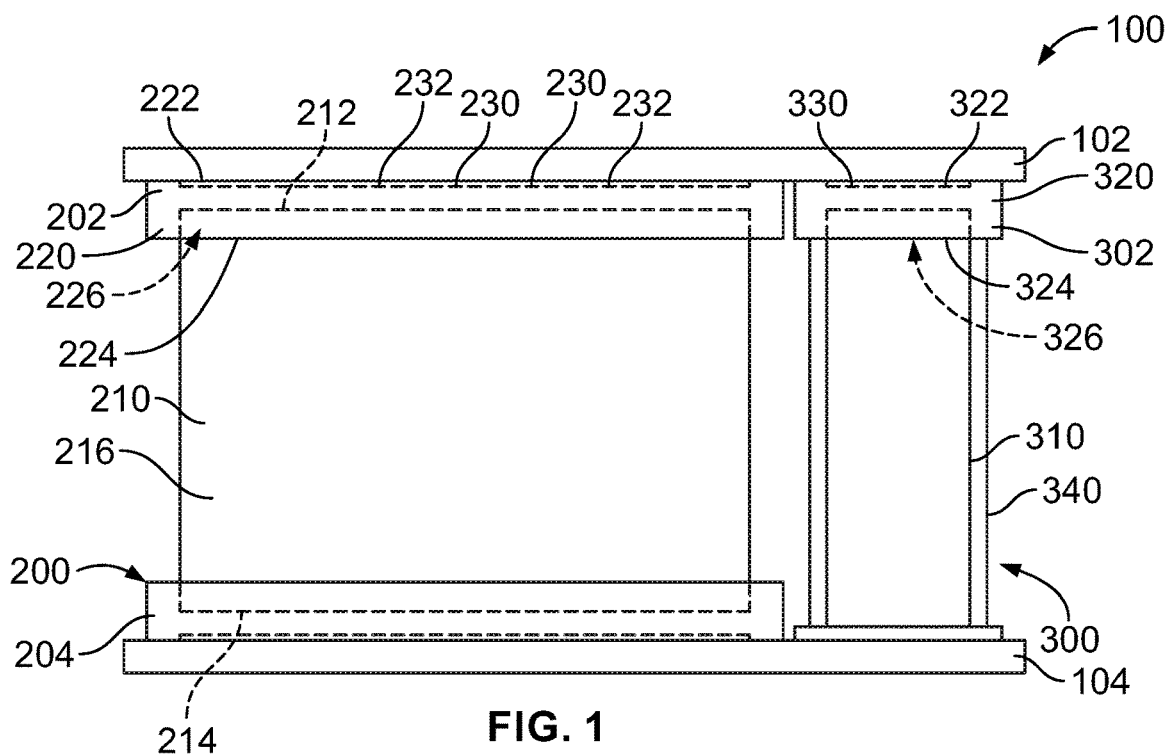
FIG. 1 illustrates a mezzanine connector system in accordance with an exemplary embodiment.

FIG. 1 illustrates a mezzanine connector system 100 in accordance with an exemplary embodiment. The mezzanine connector system 100 creates an electrical connection between a first circuit board 102 and a second circuit board 104. The first and second circuit boards 102, 104 are spaced apart from each other and parallel to each other. The first circuit board 102 may include one or more electrical components coupled thereto. The second circuit board 104 may include one or more electrical components coupled thereto.

The mezzanine connector system 100 includes a data connector assembly 200 and a power connector assembly 300 separate and discrete from the data connector assembly 200. The power connector assembly 300 may be positioned immediately adjacent the data connector assembly 200. Optionally, the power connector assembly 300 may abut against the data connector assembly 200. The power connector assembly 300 transmits power between the first circuit board 102 and the second circuit board 104. The data communication assembly 200 transmits data between the first circuit board 102 and the second circuit board 104.

The data connector assembly 200 includes a circuit card 210 configured to be electrically connected to the first circuit board 102 and/or the second circuit board 104. The circuit card 210 includes a first card edge 212 and a second card edge 214 opposite the first card edge 212. The circuit card 210 includes a front surface 216 and a rear surface (not shown) opposite the front surface 216. In various embodiments, the circuit card 210 may include electrical components on the front surface 216 and/or the rear surface. For example, processors, memory modules, communication modules, or other electrical components may be mounted to the front surface 216 and/or the rear surface. In various embodiments, the circuit card 210 may include an antenna on the front surface 216 and/or the rear surface.

In an exemplary embodiment, the data connector assembly 200 includes a first data card edge connector 202 coupled to the first circuit board 102 and a second data card edge connector 204 coupled to the second circuit board 104. The circuit card 210 is plugged into the first data card edge connector 202 and/or the second data card edge connector 204. In the illustrated embodiment, the circuit card 210 is electrically connected to both the first and second data card edge connectors 202, 204 to electrically connect the first and second circuit boards 102, 104. For example, the first card edge 212 is plugged into the first data card edge connector 202 and the second card edge 214 is plugged into the second data card edge connector 204. Data may be transmitted between the first and second circuit boards 102, 104 through the circuit card 210.

In various embodiments, the first and second data card edge connectors 202, 204 are similar and may include similar components. Optionally, the first and second data card edge connectors 202, 204 may be identical to one another. The data card edge connector 202 includes a connector housing 220 extending between a first end 222 and a second end 224. The first end 222 is mounted to the first circuit board 102. The second end 224 includes a card slot 226 that receives the circuit card 210. In an exemplary embodiment, the connector housing 220 holds a plurality of signal contacts 230 and a plurality of ground contacts 232.

The ground contacts 232 may be interspersed with the signal contacts 230, such as between pairs of the signal contacts 230. In an exemplary embodiment, the connector housing 220 holds the signal contacts 230 and the ground contacts 232 on both sides of the card slot 226 for mating with both the front surface 216 and the rear surface of the circuit card 210. The signal contacts 230 and the ground contact 232 are configured to be surface mounted to the first circuit board 102. For example, ends of the signal and ground contacts 230, 232 may be soldered to circuit pads on the surface of the first circuit board 102.

Figure 2:
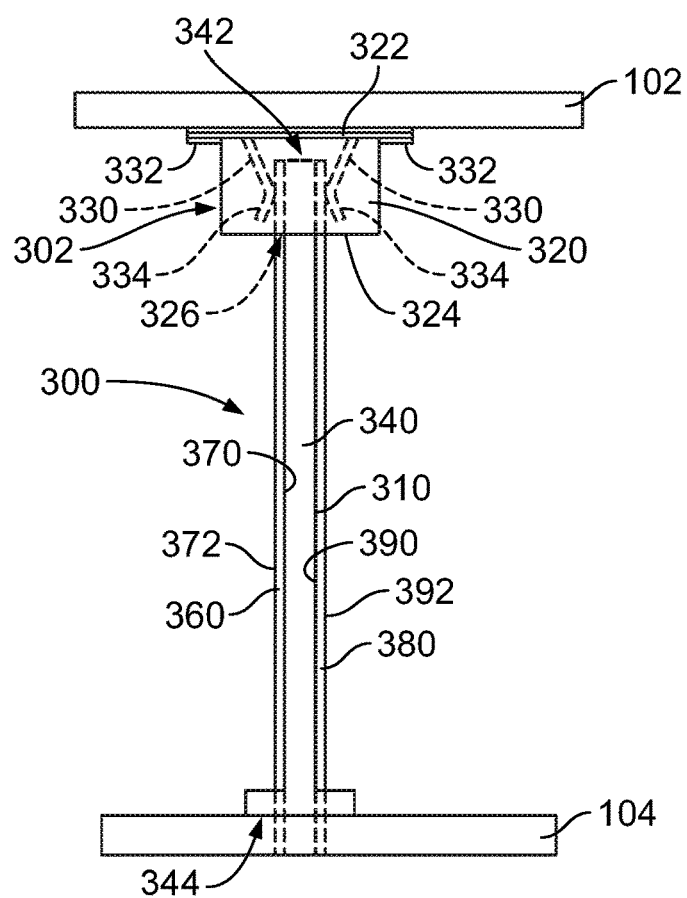
FIG. 2 is a side view of a power connector assembly of the mezzanine connector system in accordance with an exemplary embodiment.

With additional reference to FIG. 2, which is a side view of the power connector assembly 300, the power connector assembly 300 includes a power card edge connector 302 and a bladed power connector 310 electrically connected to the power card edge connector 302. For example, the bladed power connector 310 may be plugged into the power card edge connector 302. The power card edge connector 302 is electrically connected to the first circuit board 102. The bladed power connector 310 is electrically connected to the second circuit board 104. In an exemplary embodiment, the power connector assembly 300 is positioned adjacent the data connector assembly 200 such that the bladed power connector 310 is coplanar with the circuit card 210.

The power card edge connector 302 includes a housing 320 extending between a first end 322 and a second end 324. The first end 322 is mounted to the first circuit board 102. The second end 324 includes a card slot 326 that receives the bladed power connector 310. In an exemplary embodiment, the housing 320 holds a plurality of power contact 330. In an exemplary embodiment, the housing 320 holds the power contacts 330 on both sides of the card slot 326 for mating with both sides of the bladed power connector 310. The power contacts 330 are configured to be surface mounted to the first circuit board 102. In an exemplary embodiment, first contact ends 332 of the power contacts 330 may be soldered to circuit pads on the surface of the first circuit board 102. For example, the first contact ends 332 may include solder tails configured to be soldered to the first circuit board 102. Second contact ends 334 of the power contacts 330 extend into the card slot 326 for electrical connection with the bladed power connector 310. For example, the second contact ends 334 may include spring beams configured to be spring loaded against the bladed power connector 310 when the bladed power connector 310 is loaded into the card slot 326.

In various embodiments, the housing 320 may be mounted to the first circuit board 102 adjacent the connector housing 220. Optionally, the housing 320 and/or the connector housing 220 may include locating features for locating the housing 320 relative to the connector housing 220. In various embodiments, features may be provided to couple the housing 320 and the connector housing 220, such as for mounting the housing 320 and the connector housing 220 to the first circuit board 102 has a single unit. In other various embodiments, the housing 320 may be formed integral with the connector housing 220, such as being co-molded with the connector housing 220.

The bladed power connector 310 includes a dielectric frame 340 holding a first blade 360 and a second blade 380. The dielectric frame 340 electrically isolates the first blade 360 from the second blade 380. The first blade 360 may be a positively powered blade and the second blade 380 may be a negatively powered blade. The first blade 360 may be a voltage blade and the second blade 380 may be a ground blade. In an exemplary embodiment, the dielectric frame 340 is formed in situ on the first and second blades 360, 380.

For example, the dielectric frame 340 may include an overmolded body that is overmolded on the first and second blades 360, 380. Alternatively, the dielectric frame 340 may include an injection molded body that is injection molded around the first and second blades 360, 380.

The dielectric frame 340 extends between a first end 342 and a second end 344. The first end 342 is configured to be plugged into the card slot 326 of the housing 320. The second end 344 faces the second circuit board 104. The second end 344 may be mounted to the second circuit board 104. For example, the second end 344 may include mounting features, such as pins configured to be plugged into the second circuit board 104. In alternative embodiments, the mounting features may include mounting tabs having openings configured to receive fasteners, such as threaded fasteners used to secure the bladed power connector 310 to the second circuit board 104. The dielectric frame 340 includes a first side 346 and a second side 348. The first blade 360 is provided at the first side 346. The second blade 380 is provided at the second side 348.

The first blade 360 includes a planar stamped plate having an inner surface 370 and an outer surface 372. The inner surface 370 faces inward toward the dielectric frame 340. The outer surface 372 faces outward away from the dielectric frame 340 and away from the second blade 380. The outer surface 372 is configured to interface with the mating beams of the power contacts 330 when the bladed power connector 310 is received in the card slot 326 of the power card edge connector 302. Optionally, the first blade 360 may have a generally rectangular shape having a width, a height, and a thickness. The width and the thickness may define a current carrying capacity of the first blade 360. For example, by increasing the width or increasing the thickness, the current carrying capacity of the first blade 360 may be increased. The power connector assembly 300 is scalable to increase or decrease the current carrying capacity by varying the width and/or the thickness of the first blade 360.

The second blade 380 includes a planar stamped plate having an inner surface 390 and an outer surface 392. The inner surface 390 faces inward toward the dielectric frame 340. The outer surface 392 faces outward away from the dielectric frame 340 and away from the first blade 360. The outer surface 392 is configured to interface with the mating beams of the power contacts 330 when the bladed power connector 310 is received in the card slot 326 of the power card edge connector 302. Optionally, the second blade 380 may have a generally rectangular shape having a width, a height, and a thickness. The width and the thickness may define a current carrying capacity of the second blade 380. For example, by increasing the width or increasing the thickness, the current carrying capacity of the second blade 380 may be increased. The power connector assembly 300 is scalable to increase or decrease the current carrying capacity by varying the width and/or the thickness of the second blade 380.

FIG. 3 is a front perspective view of the power connector assembly 300 in accordance with an exemplary embodiment. FIG. 4 is a rear perspective view of the power connector assembly 300 in accordance with an exemplary embodiment. FIGS. 3 and 4 show the connector housing 220 relative to the housing 320 for illustration. FIGS. 3 and 4 show the bladed power connector 310 poised for loading into the card slot 326 of the power card edge connector 302.

The dielectric frame 340 extends between a first end 342 and the second end 344. The dielectric frame 340 includes an end wall 350 at the first end 342. The end wall 350 is configured to face the second circuit board 104 (shown in FIG. 1). The dielectric frame 340 includes a first edge wall 352 extending from the end wall 350 and a second edge wall 354 extending from the end wall 350. In an exemplary embodiment, pockets are formed between the first and second edge walls 354 that receive the first and second blades 360, 380. The pockets allow the first and second blades 360, 380 to be recessed in the dielectric frame 340. The size (for example, height, width, thickness) of the dielectric frame 340 may be varied to fit various form factors of the power card edge connector 302. The dielectric frame 340 may extend beyond sides of the blades 360, 380 and/or beyond the ends of the blades 360, 380. The dielectric frame 340 is located between the blades 360, 380.

In an exemplary embodiment, an insulator 356 is positioned between the first and second edge walls 352, 354. The insulator 356 is located between the first blade 360 and the second blade 380. The insulator 356 electrically isolates the first blade 360 from the second blade 380. In an exemplary embodiment, the insulator 356 is defined by the dielectric frame 340. For example, the dielectric frame 340 includes a mid-wall 358 extending between the first end wall 352 and the second edge wall 354. The mid-wall 358 is located between the first blade 360 and the second blade 380. The mid-wall 358 is molded with the edge walls 352, 354 and the end wall 350. For example, during the molding process, the mid-wall 358 is molded in place in the space between the first and second blades 360, 380. In an exemplary embodiment, the connecting elements 359 extend from the mid-wall 358 at the first side 346 and the second side 348. The connecting elements 356 extend through the first and second blades 360, 380 to position and retain the first and second blades 360, 380 on the dielectric frame 340.

The first blade 360 extends between a first mating edge 362 and a first terminating end 364 opposite the first mating edge 362. The first mating edge 362 is configured to be received in the card slot 326. The first mating edge 362 is located proximate to the first end 342 of the dielectric frame 340. Optionally, the first end 342 of the dielectric frame 340 may extend beyond the mating edge 362 to provide a lead-in surface for loading the bladed power connector 310 into the card slot 326. The first terminating end 362 is located proximate to the second end 344 of the dielectric frame 340.

In an exemplary embodiment, the terminating ends 364 includes press-fit pins 366 extending from the terminating end 364 of the blade 360. The press-fit pins 366 are configured to be press-fit into corresponding plated vias of the second circuit board 104 to electrically connect the blade 360 to the second circuit board 104. The press-fit pins 366 are stamped with the plates structure of the blade 360. The press-fit pins 366 are coplanar with the plate structure of the blade 360. In an exemplary embodiment, the press-fit pins 366 extend beyond the end wall 350 of the dielectric frame 340. The press-fit pins 366 are compliant pins configured to be compressed in the plated vias of the second circuit board 104 to mechanically and electrically coupled to the blade 360 to the second circuit board 104. In the illustrated embodiment, the press-fit pins 366 are eye-of-the-needle pins. In an exemplary embodiment, the press-fit pins 366 may be loaded into the plated vias of the second circuit board 104 until the end wall 350 is seated on the surface of the second circuit board 104. The end wall 350 defines a loading stop for loading the press-fit pins 366 into the plated vias of the second circuit board 104. In alternative embodiments, the terminating ends 364 may include solder tails configured to be soldered in plated vias or surface mounted to the second circuit board 104.

The second blade 380 extends between a second mating edge 382 and a second terminating end 384 opposite the second mating edge 382. The second mating edge 382 is configured to be received in the card slot 326. The second mating edge 382 is located proximate to the second end 344 of the dielectric frame 340. Optionally, the second end 342 of the dielectric frame 340 may extend beyond the mating edge 382 to provide a lead-in surface for loading the bladed power connector 310 into the card slot 326. The second terminating end 382 is located proximate to the second end 344 of the dielectric frame 340.

In an exemplary embodiment, the terminating end 384 includes press-fit pins 386 extending from the terminating end 384 of the blade 380. The press-fit pins 386 are configured to be press-fit into corresponding plated vias of the second circuit board 104 to electrically connect the blade 380 to the second circuit board 104. The press-fit pins 386 are stamped with the plates structure of the blade 380. The press-fit pins 386 are coplanar with the plates structure of the blade 380. In an exemplary embodiment, the press-fit pins 386 extend beyond the end wall 350 of the dielectric frame 340. The press-fit pins 386 are compliant pins configured to be compressed in the plated vias of the second circuit board 104 to mechanically and electrically coupled to the blade 380 to the second circuit board 104. In the illustrated embodiment, the press-fit pins 386 are eye-of-the-needle pins. In an exemplary embodiment, the press-fit pins 386 may be loaded into the plated vias of the second circuit board 104 until the end wall 350 is seated on the surface of the second circuit board 104. The end wall 350 defines a loading stop for loading the press-fit pins 386 into the plated vias of the second circuit board 104. In an exemplary embodiment, the second press-fit pins 386 are offset relative to the first press-fit pins 366 (for example, shifted side to side). In alternative embodiments, the terminating ends 384 may include solder tails configured to be soldered in plated vias or surface mounted to the second circuit board 104.

Figure 5:
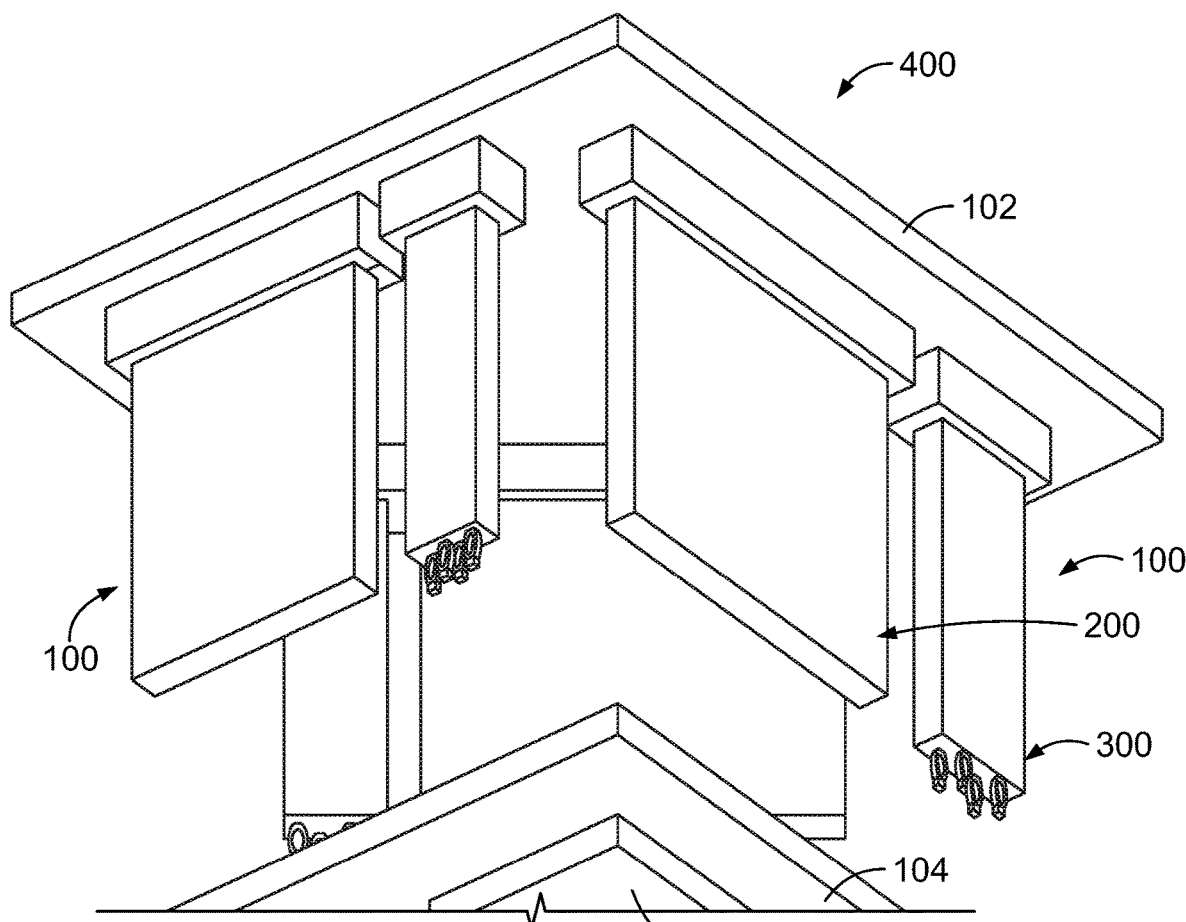
FIG. 5 is a bottom perspective view of an antenna assembly utilizing the mezzanine connector system in accordance with an exemplary embodiment.
Figure 6:
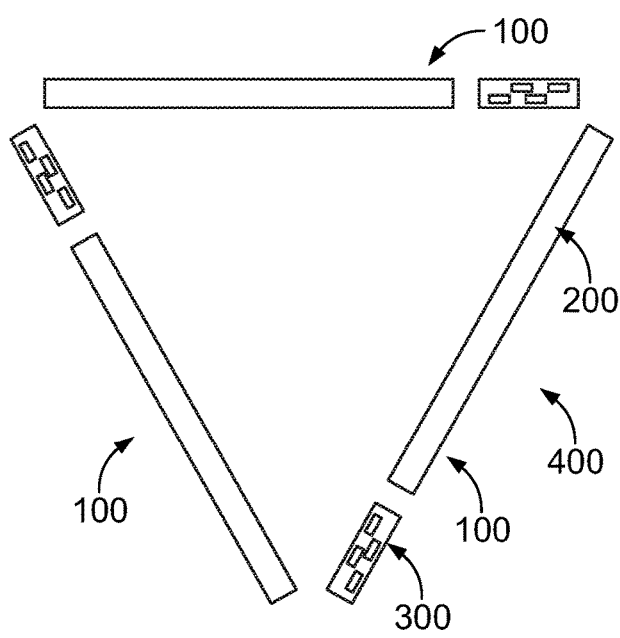
FIG. 6 is a bottom view of an antenna assembly utilizing the mezzanine connector system in accordance with an exemplary embodiment.

FIG. 5 is a bottom perspective view of the antenna assembly 400 utilizing the mezzanine connector system 100 in accordance with an exemplary embodiment. FIG. 6 is a bottom view of an antenna assembly 400 utilizing the mezzanine connector system 100 in accordance with an exemplary embodiment. In an exemplary embodiment, the antenna assembly 400 uses an array of the mezzanine connectors to form an antenna. For example, the mezzanine connectors may be arranged in a triangular antenna array. Each leg of the triangular antenna array includes one of the data connector assemblies 200 of the power connector assemblies 300.

In the illustrated embodiment, the first circuit board 102 is a motherboard. The data connector assemblies 200 are electrically connected to the motherboard. The circuit cards include circuit traces forming an antenna. The power connector assemblies 300 are electrically connected to the motherboard. The motherboard may feed power to the power connector assemblies 300. In the illustrated embodiment, the second circuit board 102 includes a power plane receiving power from the power connector assemblies 300. An electrical component, such as a voltage regulator module 106 may be mounted to the second circuit board 104.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A power connector assembly comprising:
a power card edge connector including a housing extending between a first end and a second end, the first end configured to be mounted to a first circuit board, the second end including a card slot, the power card edge connector including power contacts held by the housing, the power contacts including first contact ends configured to be surface mounted to the first circuit board and second contact ends extending into the card slot; and
a bladed power connector including a dielectric frame extending between a first end and a second end, the second end configured to face a second circuit board, the first end being received in the card slot, the dielectric frame having a first side and a second side opposite the first side, the bladed power connector including a first blade at the first side of the dielectric frame and a second blade at the second side of the dielectric frame, the first blade including a first mating edge and a first terminating end opposite the first mating edge, the first terminating end including first press-fit pins configured to be press-fit into the second circuit board, the second blade including a second mating edge and a second terminating end opposite the second mating edge, the second terminating end including second press-fit pins configured to be press-fit into the second circuit board.

2. The power connector assembly of claim 1, wherein the first blade is planar and the first press-fit pins are coplanar with the first blade, and wherein the second blade is planar and the second press-fit pins are coplanar with the second blade.

3. The power connector assembly of claim 1, wherein the first blade includes a stamped plate, the first press-fit pins being stamped with the stamped plate, and wherein the second blade includes a stamped plate, the second press-fit pins being stamped with the stamped plate.

4. The power connector assembly of claim 1, wherein the power contacts include solder tails at the first contact ends being soldered to the first circuit board and the power contacts include mating beams at the second contact ends extending into the card slot to mate with the first and second blades.

5. The power connector assembly of claim 1, wherein the first blade includes an inner surface and an outer surface, the second blade including an inner surface and an outer surface, the outer surfaces facing in opposite directions and being exposed for mating with the power contacts.

6. The power connector assembly of claim 1, wherein an insulator is located between the first and second blades.

7. The power connector assembly of claim 6, wherein the dielectric frame defines the insulator.

8. The power connector assembly of claim 1, wherein the dielectric frame includes an overmolded body being overmolded over the first and second blades.

9. The power connector assembly of claim 1, wherein the dielectric frame is formed in situ over the first and second blades.

10. The power connector assembly of claim 1, wherein the dielectric frame includes connecting elements mechanically connecting the first and second blades.

11. The power connector assembly of claim 1, wherein the dielectric frame includes an end wall at the second end, the dielectric frame includes edge walls extending from the end walls to the first end, and the dielectric frame includes a mid-wall between the edge walls, the mid-wall located between the first and second blades.

12. A mezzanine connector system comprising:
a data connector assembly including a data card edge connector and a circuit card coupled to the data card edge connector, the data card edge connector including a connector housing configured to be mounted to a first circuit board, the connector housing having a card slot receiving the circuit card, the data card edge connector including signal contacts and ground contacts held by the connector housing for mating with the circuit card, the signal contacts and the ground contacts configured to be surface mounted to the first circuit board; and
a power connector assembly separate and discrete from the data connector assembly, the power connector assembly including a power card edge connector and a bladed power connector coupled to the power card edge connector, the power card edge connector including a housing extending between a first end and a second end, the first end configured to be mounted to the first circuit board, the second end including a card slot, the power card edge connector including power contacts held by the housing, the power contacts including first contact ends configured to be surface mounted to the first circuit board and second contact ends extending into the card slot, the bladed power connector including a dielectric frame holding a first blade at a first side of the dielectric frame and a second blade at a second side of the dielectric frame, the first blade including a first mating edge being received in the card slot and a first terminating end opposite the first mating edge, the first terminating end including first press-fit pins configured to be press-fit into a second circuit board, the second blade including a second mating edge being received in the card slot and a second terminating end opposite the second mating edge, the second terminating end including second press-fit pins configured to be press-fit into the second circuit board.

13. The mezzanine connector system of claim 12, wherein the power connector assembly is positioned adjacent the data connector assembly such that the bladed power connector is coplanar with the circuit card.

14. The mezzanine connector system of claim 12, wherein the first blade is planar and the first press-fit pins are coplanar with the first blade, and wherein the second blade is planar and the second press-fit pins are coplanar with the second blade.

15. The mezzanine connector system of claim 12, wherein the first blade includes a stamped plate, the first press-fit pins being stamped with the stamped plate, and wherein the second blade includes a stamped plate, the second press-fit pins being stamped with the stamped plate.

16. The mezzanine connector system of claim 12, wherein the power contacts include solder tails at the first contact ends being soldered to the first circuit board and the power contacts include mating beams at the second contact ends extending into the card slot to mate with the first and second blades.

17. The mezzanine connector system of claim 12, wherein the dielectric frame is formed in situ over the first and second blades.

18. The mezzanine connector system of claim 12, wherein the dielectric frame includes an end wall at the first end, the dielectric frame includes edge walls extending from the end walls to the second end, and the dielectric frame includes a mid-wall between the edge walls, the mid-wall located between the first and second blades.

19. An antenna assembly comprising:
a first circuit board having a first board surface;
a second circuit board spaced apart from and parallel to the first circuit board, the second circuit board having a second board surface facing the first board surface;
a data connector assembly including a data card edge connector and a circuit card coupled to the data card edge connector, the circuit card including an antenna circuit, the data card edge connector including a connector housing mounted to the first board surface of the first circuit board, the connector housing having a card slot receiving the circuit card, the data card edge connector including signal contacts and ground contacts held by the connector housing for mating with the circuit card, the signal contacts and the ground contacts configured to be surface mounted to the first board surface of the first circuit board; and
a power connector assembly separate and discrete from the data connector assembly, the power connector assembly including a power card edge connector and a bladed power connector coupled to the power card edge connector, the power card edge connector including a housing extending between a first end and a second end, the first end mounted to the first board surface of the first circuit board, the second end including a card slot, the power card edge connector including power contacts held by the housing, the power contacts including first contact ends surface mounted to the first board surface of the first circuit board and second contact ends extending into the card slot, the bladed power connector including a dielectric frame holding a first blade at a first side of the dielectric frame and a second blade at a second side of the dielectric frame, the first blade including a first mating edge being received in the card slot and a first terminating end opposite the first mating edge, the first terminating end including first press-fit pins press fit into vias at the second board surface of the second circuit board, the second blade including a second mating edge being received in the card slot and a second terminating end opposite the second mating edge, the second terminating end including second press-fit pins press-fit into vias at the second board surface of the second circuit board.

20. The antenna assembly of claim 19, wherein the first blade includes a planar stamped plate, the first press-fit pins being stamped with the stamped plate and being coplanar with the first blade, and wherein the second blade includes a planar stamped plate, the second press-fit pins being stamped with the stamped plate and being coplanar with the second blade, the dielectric frame including a molded body being formed in place on the stamped plates of the first and second blades with the first and second press-fit pins extending from the molded body.

\* \* \* \* \*